(12) United States Patent
Moran et al.

(10) Patent No.: US 7,189,610 B2
(45) Date of Patent: Mar. 13, 2007

(54) SEMICONDUCTOR DIODE AND METHOD THEREFOR

(75) Inventors: John David Moran, Mesa, AZ (US); Blanca Estela Kruse, Arizona City, AZ (US); Jose Rogelio Moreno, Queen Creek, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 44 days.

(21) Appl. No.: 10/966,519

(22) Filed: Oct. 18, 2004

(65) Prior Publication Data

US 2006/0084221 A1    Apr. 20, 2006

(51) Int. Cl.
*H01L 21/8234*    (2006.01)
(52) U.S. Cl. .............. 438/237; 257/E27.04; 438/328

(58) Field of Classification Search ............... 438/237; 257/481, 73
See application file for complete search history.

(56) References Cited

U.S. PATENT DOCUMENTS

| | | | | |
|---|---|---|---|---|
| 4,594,602 A | * | 6/1986 | Iimura et al. | 257/610 |
| 5,181,083 A | * | 1/1993 | Pezzani | 257/491 |
| 6,727,525 B1 | * | 4/2004 | Goerlach | 257/107 |
| 6,870,202 B2 | * | 3/2005 | Oka | 257/173 |
| 2003/0155644 A1 | * | 8/2003 | Hirao et al. | 257/706 |
| 2004/0164403 A1 | * | 8/2004 | Hirao et al. | 257/706 |
| 2005/0074197 A1 | * | 4/2005 | Tada et al. | 385/14 |

\* cited by examiner

*Primary Examiner*—Thao P. Le
(74) *Attorney, Agent, or Firm*—Robert F. Hightower

(57) ABSTRACT

In one embodiment, a diode is formed with anodes on two surfaces of a semiconductor substrate.

20 Claims, 6 Drawing Sheets

SEMICONDUCTOR DIODE AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to produce semiconductor diodes. Semiconductor diodes, including Schottky diodes, were used in many different applications and were especially useful in power supplies. In these applications, and especially in power supply applications, it was important for the diodes to have a low forward voltage and low leakage current in order to minimize power losses and provide high efficiency. In many cases, the forward voltage of the diode was not sufficiently low to provide the desired efficiency. In other cases, a low forward voltage was obtained at the expense of increased leakage current or higher cost.

Accordingly, it is desirable to have a semiconductor diode that has a low forward voltage, that has low leakage current, and that has a low cost.

For simplicity and clarity of illustration, elements in the figures are not necessarily to scale, and the same reference numbers in different figures denote the same elements. Additionally, descriptions and details of well-known steps and elements are omitted for simplicity of the description. Although the devices are explained herein as including certain N-type or P-type materials, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
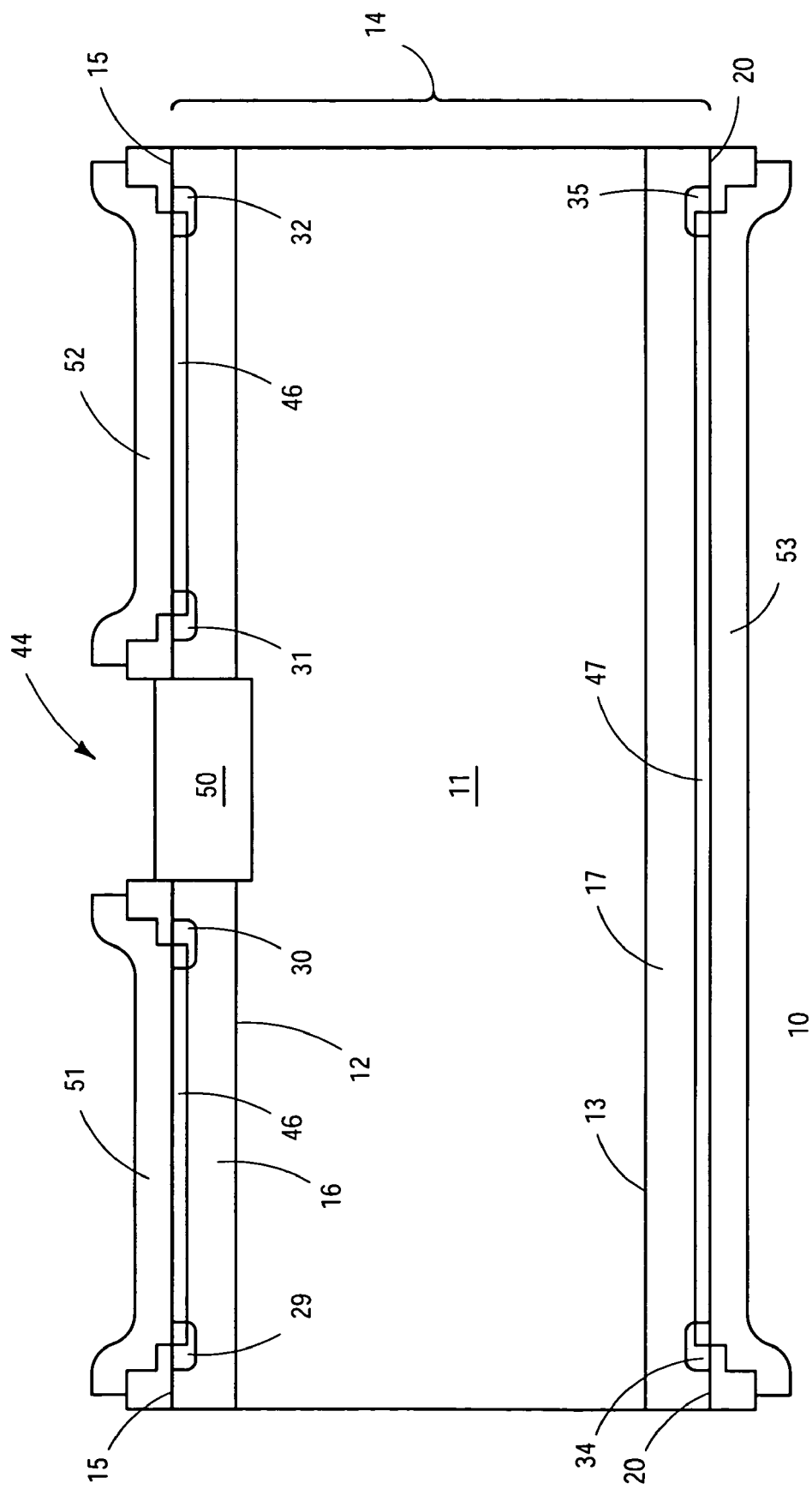
FIG. 1 schematically illustrates an enlarged cross-sectional portion of an embodiment of a Schottky diode in accordance with the present invention.

FIG. 1 schematically illustrates an enlarged cross-sectional portion of an embodiment of a Schottky diode 10 that has a low forward voltage, low leakage current, and a low-cost. Diode 10 includes a first anode 46 that is formed on a first surface 15 of a substrate 14, and a second anode 47 that is formed on a second surface 20 of substrate 14. A cathode 50 of diode 10 is also formed on first surface 15. Forming anodes on both surfaces of substrate 14 increases the area of the anode thereby lowering the forward voltage of diode 10 without increasing the size of diode 10. Keeping the size of diode 10 small minimizes the cost. As will be understood by those skilled in the art, the cathode of diode 10 is formed near the interface of anode 46 and the underlying substrate material and near the interface of anode 47 and the underlying substrate material, and that cathode 50 is the point at which electrical contact can be made to the cathode of diode 10.

Figure 2:
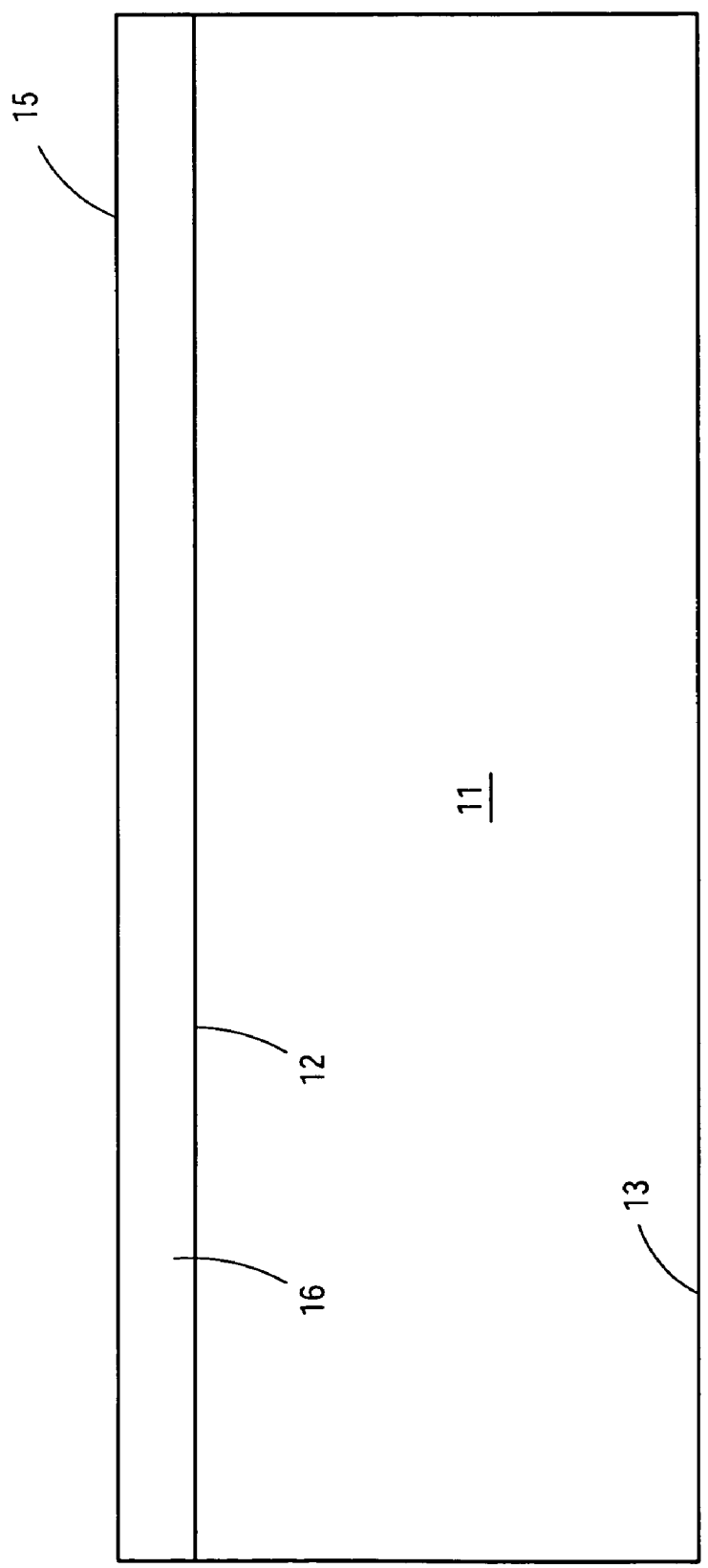
FIG. 2 schematically illustrates the Schottky diode of FIG. 1 at an early manufacturing stage according to an embodiment of a method of forming the Schottky diode of FIG. 1 in accordance with the present invention.

FIG. 2 schematically illustrates an early stage according to an embodiment of a method of forming diode 10. An N-type epitaxial layer 16 is formed on a first surface 12 of a bulk semiconductor substrate 11. Layer 16 has an outer surface that forms first surface 15. Typically, a second surface 13 of substrate 11 is covered with silicon dioxide during the formation of layer 16 in order to protect substrate 11.

Figure 3:
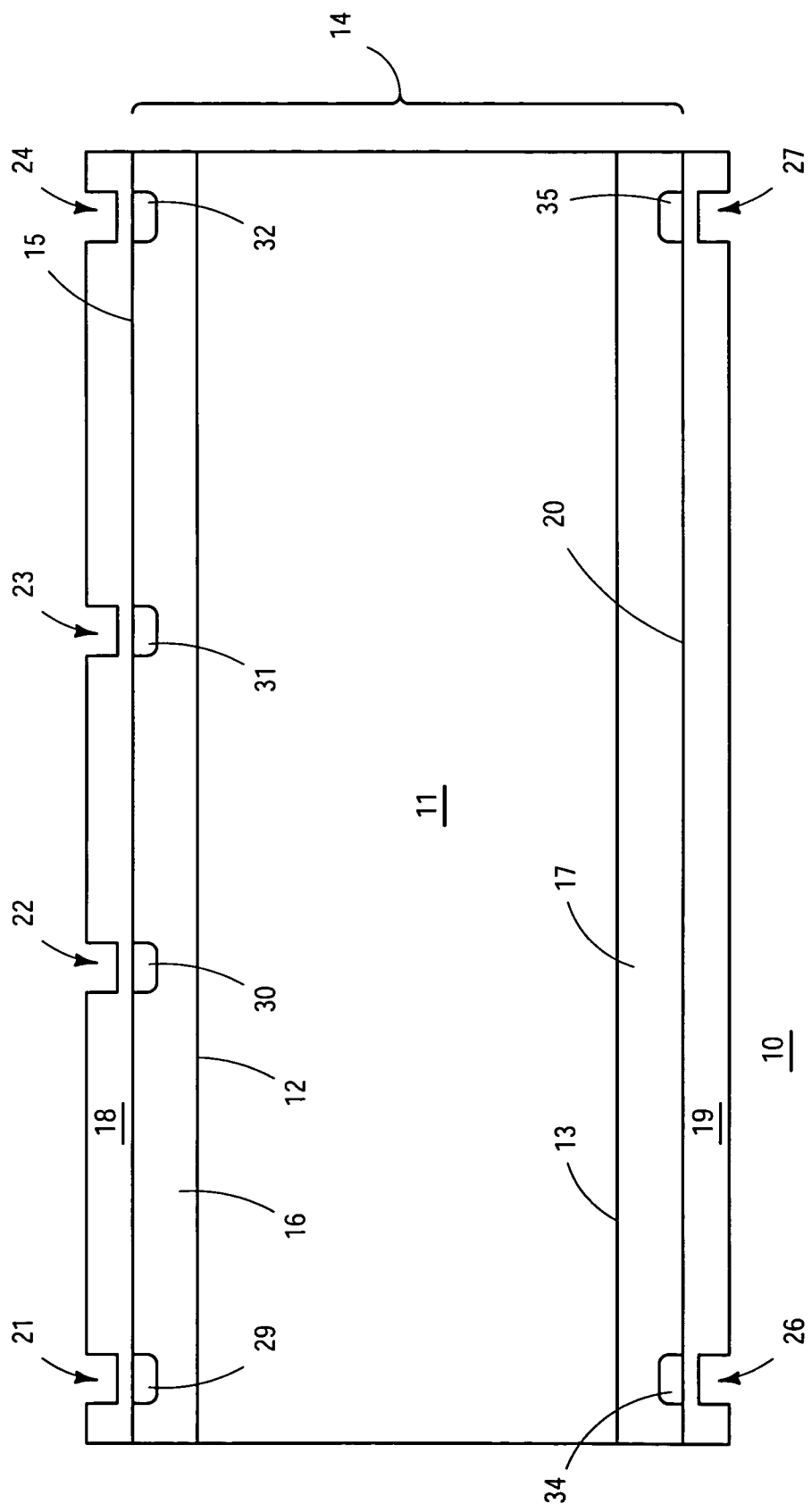
FIG. 3 through FIG. 5 schematically illustrate subsequent manufacturing stages according to an embodiment of a method of forming the Schottky diode of FIG. 1 in accordance with the present invention.

FIG. 3 schematically illustrates a subsequent stage according to an embodiment of a method of forming diode 10. After forming layer 16, a second epitaxial layer 17 is formed on surface 13 of substrate 11. An outter surface of layer 17 forms second surface 20. Typically, surface 15 of layer 16 is covered with silicon dioxide during the formation of layer 17 in order to protect layer 16. In the preferred embodiment, substrate 11 is heavily doped N-type material and layers 16 and 17 are more lightly doped N-type material. For example, substrate 11 typically has a resistivity that is no greater than about 0.0024 ohm-cm. Subsequently, a protective layer 18 is formed on surface 15 and a similar protective layer 19 is formed on layer 17. Layers 18 and 19 are utilized as a mask during subsequent processing operations and also to protect the underlying semiconductor material during subsequent operations. Layers 18 and 19 can be a variety of materials including silicon dioxide, silicon nitride, or combinations thereof. In the preferred embodiment, layers 18 and 19 are no less than about seven thousand (7,000) angstroms of silicon dioxide in order to provide the desired protection. In some embodiments, the mask may be formed from a thinner layer of oxide and an overlying layer of photoresist. In such an embodiment, the oxide may be as thin as nine hundred (900) angstroms or less with a thick overlying photoresist layer. Openings 21–24 are subsequently used to form doped regions that will function as guard rings that surround anode 46. Openings 21 and 24 are formed overlying the portion of surface 15 where the outermost or distal edges of anode 46 are to be formed and openings 22 and 23 are formed overlying the portion of surface 15 where the innermost edges of anode 46 are to be formed. Similarly, openings 26 and 27 are formed overlying the portion of surface 20 where the outermost or distal edges of anode 47 are to be formed. In the preferred embodiment, openings 21–24 and 26–27 are formed to extend through respective layer 18 and 19 to expose a portion of the underlying surface of substrate 11. Masks (not shown) generally are applied to layers 18 and 19 and then patterned to expose layers 18 and 19 at the positions of opening 21–24 and 26–27. Typically, openings 26 and 27 are aligned with respective openings 21 and 24, however, such alignment is not required. In most cases, a two-sided alignment tool is utilized for forming and exposing the masks. Such two-sided alignment tools are well known to those skilled in the art.

Thereafter, doped regions 29–32 are formed on surface 15 through respective openings 21–24 and doped regions 34–35 are similarly formed on surface 20 through respective openings 26 and 27. In the preferred embodiment, boron is implanted through openings 21–24 and 26–27 to form doped regions 29–32 and 34–35 as P-type regions having a resistivity of about 0.3 to 20.0 ohm-cm. In this preferred embodiment, a portion of the exposed surface of substrate 11 is oxidized during the activation of the dopants. As a result of the oxidation, an insulator layer is formed on the surface of substrate 11 and within openings 21–24 and 26–27 as shown in FIG. 3. As will be seen further hereinafter, this insulator layer within openings 21–24 and 26–27 will be used as a mask during subsequent procession operations and eventually is used as a portion of an edge termination structure that assists in providing a high breakdown voltage. Also in this preferred embodiment, the openings in layer 18 and the underlying doped regions are formed as a closed structure so that openings 21 and 24 and respective underlying doped regions 29 and 32 are one continuous region. Similarly, the preferred embodiment of openings 22 and 23 and underlying doped regions 30 and 31 and also openings 26 and 27 and underlying doped regions 34 and 35 is one closed structure.

In other embodiments, a portion of layer 18 may be left in the bottom of openings 21–24 instead of making openings 21–24 extend through layer 18. Similarly, a portion of layer 19 may be left in the bottom of openings 26 and 27. In one example embodiment, about three thousand (3000) angstroms is left in the bottom of openings 21–24 and 26–27.

Figure 4:
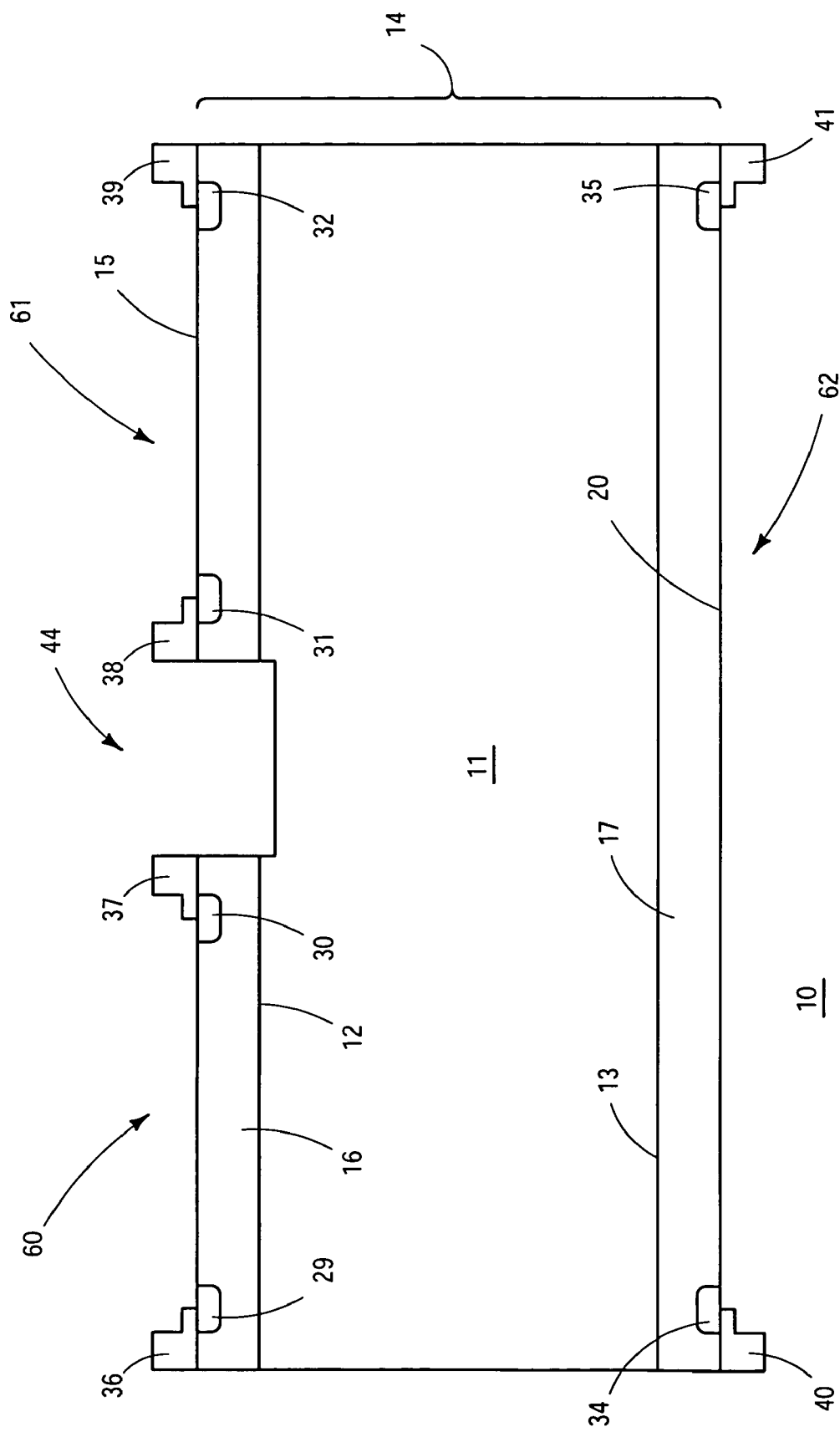

Referring to FIG. 4, a portion of layer 18 that extends from approximately region 29 across surface 15 to region 30 is removed in order to form an opening 60 that exposes a portion of surface 15 where a first portion of anode 46 will be formed. Similarly, the portion of layer 18 that extends from approximately region 31 to region 32 is also removed during the same procedure to form an opening 61 that expose another portion of surface 15 where a second portion of anode 46 will be formed. Similarly, a portion of layer 19 that extends from approximately region 34 across surface 20 to region 35 is removed in order to form an opening 62 that expose a portion of surface 20 where anode 47 will be formed. Typically, opening 60 extends to expose a portion of regions 29 and 30, opening 61 extends to expose a portion of regions 31 and 32, and opening 62 extends to expose a portion of regions 34 and 35. Openings 60, 61, and 62 preferably expose about one-half of respective openings 29 and 30, 31 and 32, and 34 and 35. Removing the portions of layer 18 between regions 29–30 and between regions 31–32 leaves portions of layer 18 on surface 15 as respective edge termination structures 36–37 and 38–39. Similarly, removing the portion of layer 19 between regions 34–35 leaves edge termination structures 40 and 41 on surface 20. Additionally, an opening 44 is formed through the portion of layer 18 that is between doped regions 30 and 31 and preferably is between structures 37 and 38. Opening 44 is formed to extend through layer 18 and expose a portion of substrate 11 in order to ensure a low resistance electrical contact to substrate 11. The distance between opening 44 and regions 30 and 31 is determined by the desired breakdown voltage of diode 10. Typically, opening 44 is between about two microns and about fifty microns from regions 30 and 31.

Figure 5:
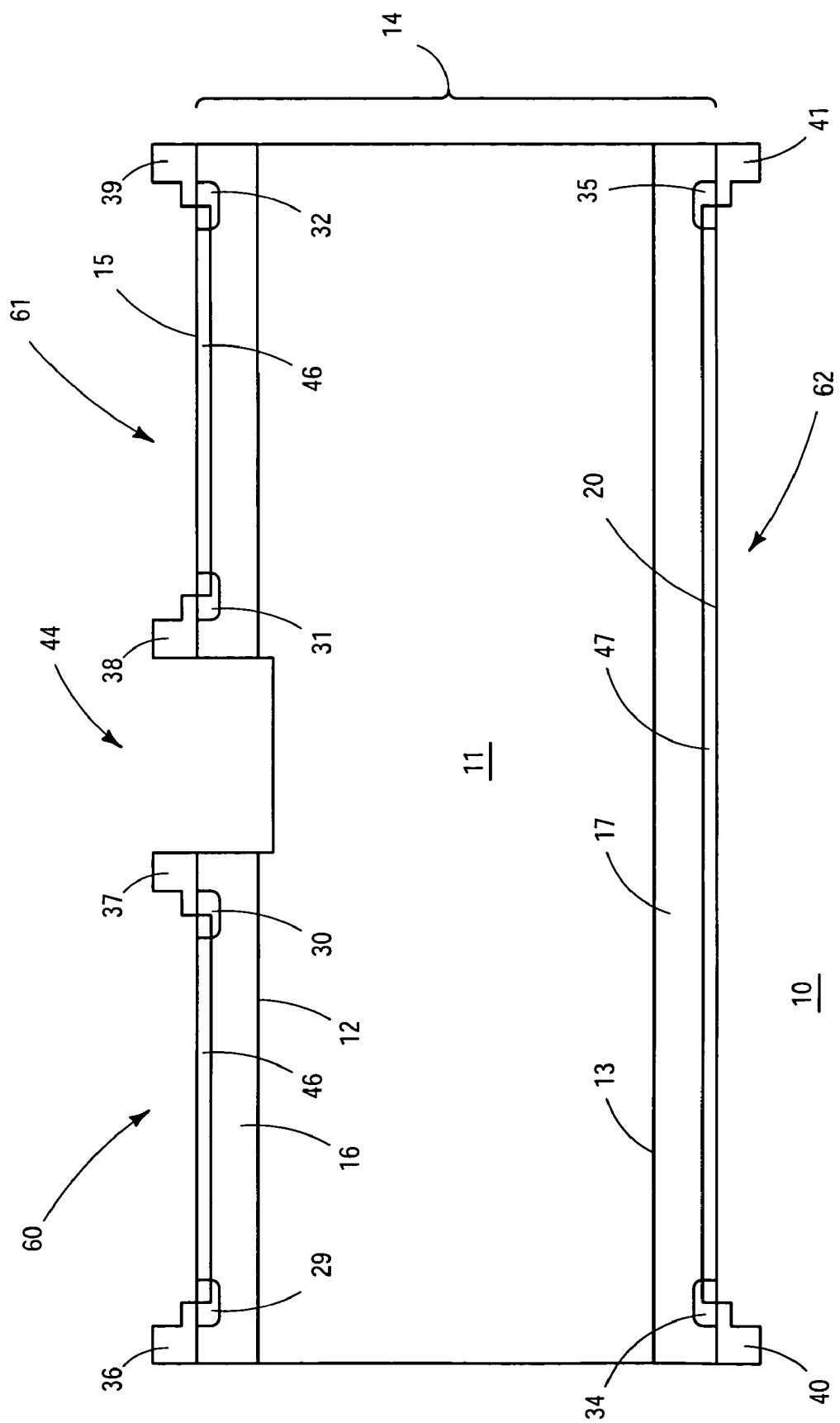

Referring to FIG. 5, anode 46 is formed on the exposed portions of surface 15 between edge termination structures 36 and 37 and between edge termination structures 38 and 39. In the preferred embodiment, a mask (not shown) is applied that protects opening 44, then a blanket layer of a Schottky barrier material is applied to cover the exposed portions of surface 15. Similarly, a blanket layer of the Schottky barrier material is applied to cover surface 20 between structures 40 and 41. The Schottky barrier material can be any material that forms a Schottky barrier. For example, the material may be nickel-platinum, nickel, chrome, titanium, or platinum. For the case where heating is required to form the Schottky barier, diode 10 is heated so that a portion of the material diffuses into layers 16 and 17 to form anodes 46 and 47 as metal-silicide regions.

Referring again to FIG. 1, after anodes 46 and 47 are formed, conductors 51 and 52 are formed in electrical contact with anode 46. A similar conductor 53 is formed in contact with anode 47, and cathode 50 is formed in opening 44 in electrical contact with substrate 11. Typically, a blanket layer of a multi-layer metal structure is applied and patterned to form cathode 50 and conductors 51–53. In the preferred embodiment, the conductor material is a layer of a titanium-tungsten followed by a layer of nickel-vanadium followed by a layer of aluminum. In this preferred embodiment, a mask (not shown) is applied to protect cathode 50 and conductors 51–53 during the removal of the exposed portions in order to leave cathode 50 and conductors 51–53.

Figure 6:
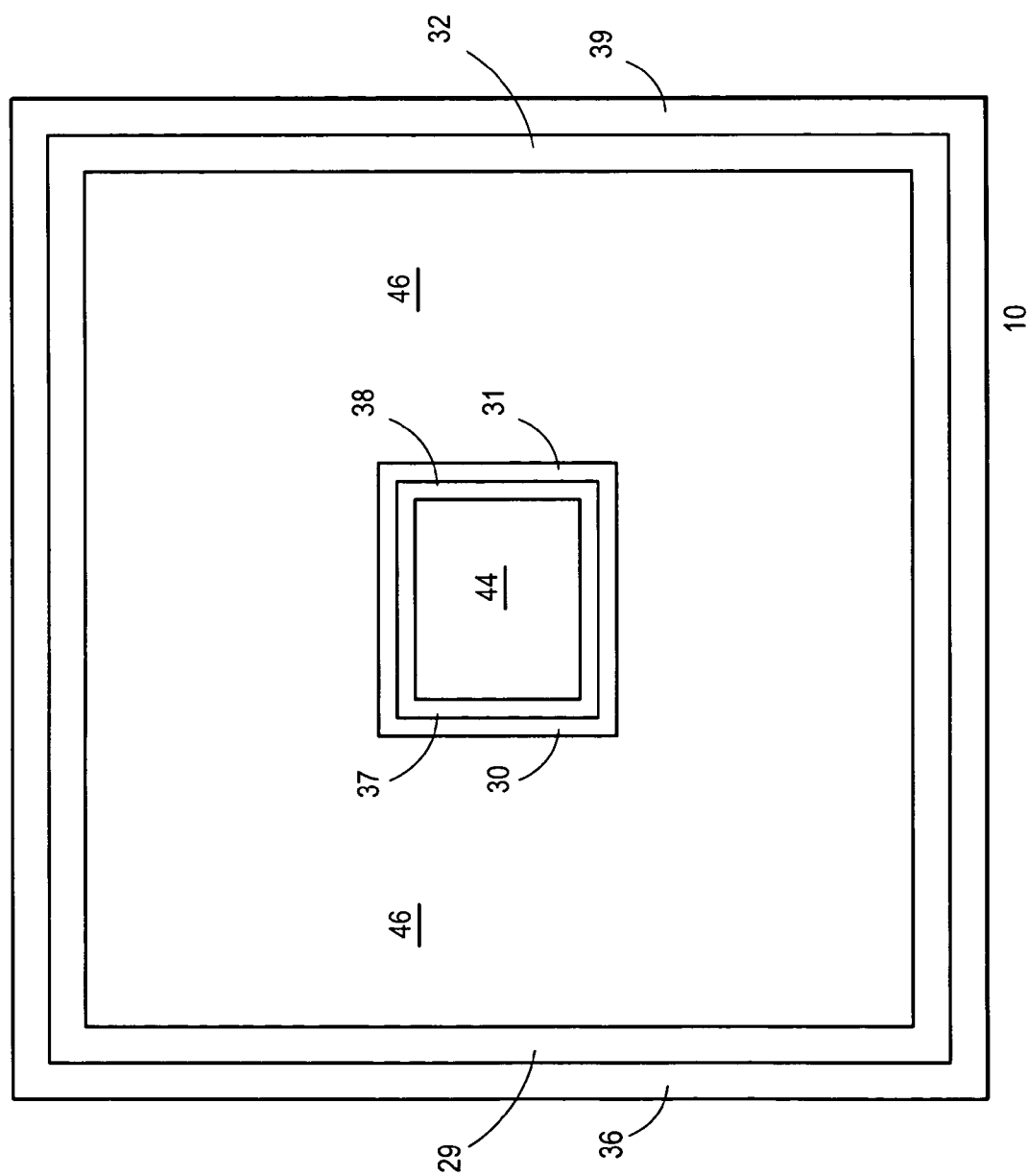
FIG. 6 schematically illustrates an enlarged plan view of an embodiment of a portion of the Schottky diode of FIG. 1 in accordance with the present invention.

FIG. 6 schematically illustrates an enlarged plan view of diode 10 prior to forming cathode 50 and conductors 51–53. The plan view illustrates the closed structure topology of structures 36 and 39, of structures 37 and 38, of doped regions 29 and 32, of doped regions 30 and 31, and of anode 46. As can be seen from the plan view, opening 44 is in the middle of diode 10 and edge termination structures 37 and 38 separate opening 44 from doped regions 30 and 31. Anode 46 extends across the surface of substrate 11 up to and encroaching into doped regions 29 and 32. Edge termination structures 36 and 39 surround the outside of anode 46. In some embodiments, opening 44 may be about two to twelve hundred (2–1200) microns wide.

As will be understood by those skilled in the art, opening 44 and respective cathode 50 may be formed in many different patterns. For example, opening 44 and cathode 50 may be circular or any other shape. Additionally, opening 44 and cathode 50 may be positioned in a different portion of anode 46 instead of centered to anode 46. Further, diode 10 may have many openings 44 and respective cathodes 50 distributed throughout anode 46 instead of one single opening 44 and cathode 50. Although the method is described for a Schottky diode, the method may also be used to form junctions diodes. For example, anodes 46 and 47 may be doped regions instead of Schottky barrier material.

The invention claimed is:

1. A method of forming a diode comprising:
providing a substrate having a first surface and a second surface that is on an opposite side of the substrate from the first surface;
forming a first anode of the diode on the first surface of the substrate; and
forming a second anode of the diode on the second surface of the substrate.

2. The method of claim 1 further including forming a first cathode of the diode on the first surface of the substrate.

3. The method of claim 2 wherein forming the first cathode of the diode on the first surface includes forming a first doped region on the first surface surrounding the first cathode and forming a second doped region on the first surface surrounding the first anode.

4. The method of claim 3 further including forming a third doped region on the second surface and surrounding the second anode.

5. The method of claim 3 wherein forming the third doped region includes forming the first doped region, the second doped region, and the third doped region of a second conductivity type.

6. The method of claim 2 further including forming a second cathode on the second surface of the substrate.

7. The method of claim 1 wherein providing the substrate having the first surface and the second surface includes providing a bulk semiconductor substrate of a first conductivity type having a first surface and a second surface, forming a first epitaxial layer of the first conductivity type on the first surface, and forming a second epitaxial layer of the first conductivity type on the second surface.

8. The method of claim 1 wherein forming the first anode of the diode on the first surface of the substrate includes forming the first anode on a first portion of the first surface and forming a cathode on a second portion of the first surface on the substrate.

9. The method of claim 1 wherein forming the first anode of the diode on the first surface of the substrate includes forming a silicide on a first portion of the first surface and further including forming an opening in a second portion of the first surface and electrically contacting a cathode of the diode through the opening.

10. The method of claim 1 wherein forming the first anode of the diode on the first surface of the substrate includes forming an epitaxial layer on a surface of a bulk semiconductor substrate, forming a silicide on a first portion of a surface of the epitaxial layer, and further including forming an opening through a second portion of the surface of the epitaxial layer and exposing a portion of the bulk semiconductor substrate, and forming a cathode of the diode on the bulk semiconductor substrate.

11. A diode comprising:

a substrate having a first surface and a second surface that is on an opposite side of the substrate from the first surface;

a first anode on the first surface; and a second anode on the second surface.

12. The diode of claim 11 wherein the substrate having the first surface and the second surface includes a bulk semiconductor substrate having a first epitaxial layer on one surface of the bulk semiconductor substrate and a second epitaxial layer on a second surface wherein a surface of the first epitaxial layer forms the first surface of the substrate and a surface of the second epitaxial layer forms the second surface of the substrate.

13. The diode of claim 12 further including an opening through a portion of the first epitaxial layer and an electrical contact to the bulk semiconductor substrate within the opening.

14. The diode of claim 11 further including a first doped region surrounding one side of the first anode and a second doped region surrounding a second side of the first doped region.

15. The diode of claim 14 further including the first doped region surrounding a cathode of the diode.

16. The diode of claim 11 further including a first cathode on the first surface.

17. The diode of claim 16 further including a second cathode on the second surface.

18. The diode of claim 16 wherein the first cathode includes an opening in the first surface with an electrical contact to the substrate within the opening.

19. The diode of claim 11 wherein the first anode and the second anode are metal-silicides.

20. The diode of claim 11 wherein the first anode and the second anode are doped regions.

* * * * *